United States Patent
Jeon et al.

(10) Patent No.: US 9,356,039 B2
(45) Date of Patent: May 31, 2016

(54) NONVOLATILE MEMORY DEVICE INCLUDING A SOURCE LINE HAVING A THREE-DIMENSIONAL SHAPE

(71) Applicant: SK HYNIX INC., Icheon (KR)

(72) Inventors: Jae Eun Jeon, Seoul (KR); Sung Lae Oh, Cheongju (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/473,195

(22) Filed: Aug. 29, 2014

(65) Prior Publication Data

US 2015/0287735 A1 Oct. 8, 2015

(30) Foreign Application Priority Data

Apr. 7, 2014 (KR) .................. 10-2014-0041016

(51) Int. Cl.
*H01L 27/115* (2006.01)

(52) U.S. Cl.
CPC ...... *H01L 27/11582* (2013.01); *H01L 27/1157* (2013.01)

(58) Field of Classification Search
CPC ................ H01L 27/1157; H01L 27/11578; H01L 27/1158; H01L 27/11582
See application file for complete search history.

(56) References Cited

U.S. PATENT DOCUMENTS

| | | | |
|---|---|---|---|
| 8,437,192 B2 | 5/2013 | Lung et al. | |
| 8,809,931 B2* | 8/2014 | Nakai | H01L 29/788 257/314 |
| 8,836,007 B2* | 9/2014 | Matsumoto | H01L 27/0688 257/314 |
| 9,053,807 B2* | 6/2015 | Hashimoto | G11C 16/26 |
| 2011/0235421 A1* | 9/2011 | Itagaki | G11C 16/0483 365/185.17 |
| 2012/0134210 A1* | 5/2012 | Maeda | G11C 16/0483 365/185.11 |
| 2013/0009235 A1* | 1/2013 | Yoo | H01L 29/7926 257/329 |
| 2014/0061748 A1* | 3/2014 | Lee | H01L 29/78 257/314 |
| 2015/0062843 A1* | 3/2015 | Higashitsuji | H01L 27/11565 361/752 |
| 2015/0109862 A1* | 4/2015 | Shibata | G11C 8/14 365/185.12 |
| 2015/0243672 A1* | 8/2015 | Kim | H01L 27/11582 257/324 |

FOREIGN PATENT DOCUMENTS

KR 10-1040154 B4 6/2011

* cited by examiner

*Primary Examiner* — Allen Parker
*Assistant Examiner* — Stephen Bradley

(57) ABSTRACT

A nonvolatile memory device includes a source line having a shape of a three-dimensional (3D) cap. The nonvolatile memory device includes a first vertical channel and a second vertical channel, a source contact disposed over the first vertical channel, a drain contact disposed over the second vertical channel, a source-line barrier disposed between the source contact and the drain contact, and a source-line plate coupling the source contact and the source-line barrier.

15 Claims, 10 Drawing Sheets

NONVOLATILE MEMORY DEVICE INCLUDING A SOURCE LINE HAVING A THREE-DIMENSIONAL SHAPE

CROSS-REFERENCE TO RELATED APPLICATION

The present application claims priority to Korean Patent Application No. 10-2014-0041016, filed on 7 Apr. 2014, the disclosure of which is hereby incorporated in its entirety by reference.

BACKGROUND

Embodiments of the present disclosure relate to a nonvolatile memory device, and more particularly, to a nonvolatile memory device including a source line having a three-dimensional (3D).

A nonvolatile memory device is a memory device capable of preserving stored data even when not powered. Various nonvolatile memory devices such as flash memories have been widely used.

Since increases in the degree of integration of a two-dimensional (2D) nonvolatile memory device, in which a single-layered memory cell is formed over a semiconductor substrate, is limited, a 3D nonvolatile memory device, in which a memory cell is formed along a channel layer vertically protruding from the semiconductor substrate, has been developed. 3D nonvolatile memory devices may have a line-shaped channel layer or a U-shaped channel layer. A 3D nonvolatile memory device having a line-shaped channel layer includes a bit line and a source line respectively formed above and below stacked memory cells. A 3D nonvolatile memory device having a U-shaped channel layer includes a bit line and a source line, both of which are disposed over stacked memory cells. Since a 3D nonvolatile memory device having a U-shaped channel layer includes a single-layered selection gate, it may have a higher degree of integration than a 3D nonvolatile memory device having a line-shaped channel layer.

However, a 3D nonvolatile memory device having a U-shaped channel layer is designed to commonly connect individual source lines using a metal line that passes above cells in the direction of a word-line. Therefore, resistance of the metal line is very high, and thus there is a high possibility of bouncing the source lines.

BRIEF SUMMARY

Various embodiments of the present disclosure are directed to a nonvolatile memory device including a source line having a 3D cap shape, which substantially obviates one or more problems due to limitations and disadvantages of the related art.

An embodiment of the present disclosure relates to a nonvolatile memory device having a U-shaped channel layer. An embodiment also relates to increasing an area of a source line of a nonvolatile memory device, resulting in reduction of resistance of the source line.

In accordance with an aspect of the present disclosure, a nonvolatile memory device includes: a first vertical channel and a second vertical channel; a source contact disposed over the first vertical channel; a drain contact disposed over the second vertical channel; and a source-line coupled to the source contact, wherein the source line includes: a source-line barrier disposed between the source contact and the drain contact; and a source-line plate coupling the source contact and the source-line barrier.

In accordance with another aspect of the present disclosure, a nonvolatile memory device includes: a pipe-connection transistor including a pipe gate and a pipe channel film buried in the pipe gate; first and second vertical channel films disposed over the pipe channel film and coupled to the pipe channel film; a plurality of word lines including first word lines stacked along the first vertical channel film and second word lines stacked along the second vertical channel film; a source contact disposed over the first vertical channel film; a drain contact disposed over the second vertical channel film; and a source-line coupled to the source contact, wherein the source line includes: a source-line barrier disposed between the source contact and the drain contact; and a source-line plate coupling the source contact and the source-line barrier.

It is to be understood that both the foregoing general description and the following detailed description of embodiments are not limiting, but are intended to provide further explanation of the invention as claimed.

DESCRIPTION OF EMBODIMENTS

Figure 1:
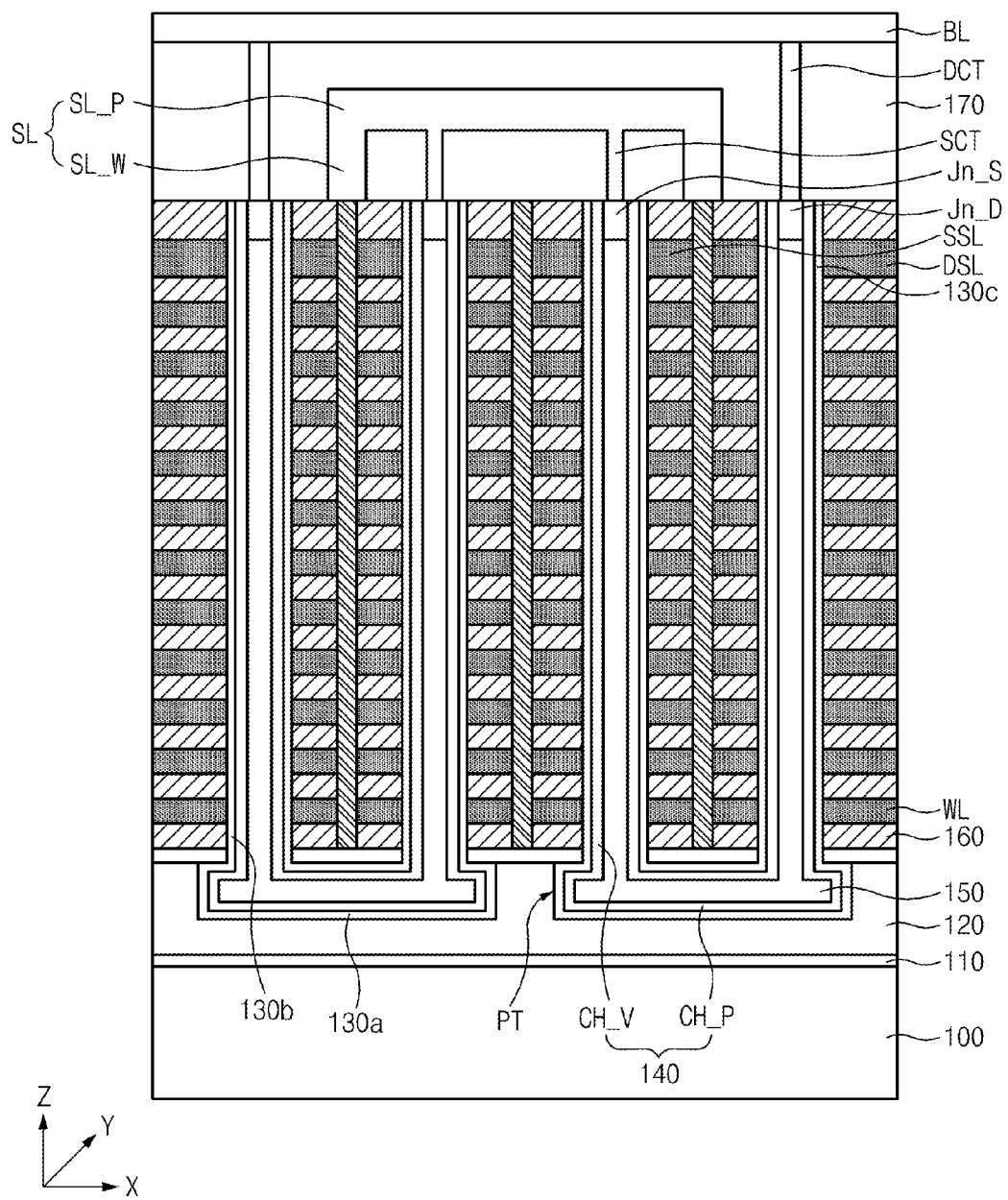
FIG. 1 illustrates a nonvolatile memory device according to an embodiment of the present disclosure.

Reference will now be made in detail to certain embodiments, examples which are illustrated in the accompanying drawings. Wherever possible, the same reference numbers will be used throughout the drawings to refer to the same or like parts. In the following description, a detailed description of well-known configurations or functions may be omitted. Terms or words used in the disclosure and the claims should be interpreted as having meanings and concepts coinciding with the technical scope and sprit of the present disclosure. Therefore, the embodiments described in the description and shown in the drawings are purely illustrative and are not intended to represent all aspects of the invention, such that various equivalents and modifications may be made without departing from the spirit of the invention.

FIG. 1 illustrates a nonvolatile memory device according to an embodiment of the present disclosure.

Referring to FIG. 1, an insulation film 110 is formed over a semiconductor substrate 100, and a pipe gate 120 is formed over the insulation film 110. A pipe channel film CH_P is buried in the pipe gate 120.

The pipe channel film CH_P is formed in a pipe trench PT that is formed in the pipe gate 120. In an embodiment, a plurality of pipe trenches PT is arranged in a matrix form, e.g., in a plurality of columns and rows, or other pattern, in a plan view. A surface of an outer wall of the pipe channel film CH_P (i.e., an inner wall of the pipe trench PT) is covered with a gate insulation film 130a. Accordingly, the gate insulation film 130a is interposed between the pipe channel film CH_P and the pipe gate 120.

A pipe-connection transistor is defined by the pipe gate 120 and the pipe channel film CH_P. Multiple layers of word lines WL are stacked over the pipe gate 120 and isolated from one another by an insulation film 160 interposed there between.

That is, word lines WL and insulation films 160 are alternately stacked. The word lines WL are formed of conductive films, and have an elongated shape extending in a line (herein, "a line shape") parallel to a Y-axis (herein, "a Y-direction"). The word lines WL and the insulation films 160 are disposed to cover a vertical channel film CH_V, which extends vertically (e.g., along a Z-axis) from the pipe channel film CH_P disposed in the pipe trench PT.

A surface of an outer wall of the vertical channel film CH_V crossing the word lines WL is covered by a multi-layered film 130b in which a tunnel insulation film, a charge trap film, and a charge blocking film are stacked. The multi-layered film 130b is interposed between the vertical channel film CH_V and the word lines WL and insulation film 160. The tunnel insulation film is in contact with the vertical channel film CH_V for the charge tunneling. In an embodiment, the tunnel insulation film includes a silicon oxide film. The charge trap film is in contact with an outer wall of the tunnel insulation film and stores data therein by trapping charges. In an embodiment, the charge trap film includes a silicon nitride film capable of trapping such charges. The charge blocking film is in contact with an outer wall of the charge trap film, and prevents charges stored in the charge trap film from moving to the outside. The charge blocking film may include a material having a higher dielectric constant (higher permittivity) than the charge trap film. Such a material may include a silicon oxide. A memory cell transistor is defined at an intersection region between the vertical channel film CH_V and a word line WL.

A selection line SSL or DSL is formed over the word lines WL. The word lines WL and the selection line SSL or DSL are isolated from each other by the insulation film 160. The selection line SSL or DSL may be formed of a conductive film, and has a line shape extending in a line in the Y-direction parallel to the word line WL. The selection line SSL or DSL may be disposed adjacent to an upper portion of the vertical channel film CH_V. A surface of an outer wall of the vertical channel film CH_V crossing the selection line SSL or DSL is covered by a gate insulation film 130c. That is, the gate insulation film 130c is interposed between the vertical channel film CH_V and the selection line SSL or DSL. A selection transistor is defined at an intersection region between the vertical channel film CH_V and the selection line SSL or DSL.

In FIG. 1, with respect to the orientation of the figure, the vertical channel films CH_V and the pipe channel film CH_P together form a U-shape. That is, a pair of vertical channel films CH_V extends vertically from opposite ends of a pipe channel film CH_P. The resulting shape resembles a "U" in which the pair of vertical channel films CH_V forms two legs of the U-shape. The two legs of such a shape may be referred to herein generally as two vertical channels for convenience of description. For convenience of illustration, FIG. 1 shows two U-shapes formed by the channel films, but embodiments are not limited thereto. A vertical channel film CH_V forming a leg of the U-shape may be formed as a hole having an insulating material, which will be described later, disposed therein.

A selection line, which encloses an upper portion of one vertical channel films CH_V in the pair, and that is coupled to a drain contact DCT, is defined as a drain selection line DSL. A selection line, which encloses an upper portion of the other vertical channel films CH_V in the pair, and that is coupled to a source contact SCT, is defined as a source selection line SSL. The drain contact DCT and the source contact SCT are insulated by an insulation layer 170.

The gate insulation films 130a and 130c and the multi-layered film 130b may be formed of the same material, and may be integrated, continuous film. In addition, an insulation layer 150 is disposed along the U-shaped channel film 140 including the pipe channel film CH_P and the vertical channel film CH_V.

A material film for a junction is disposed in an upper end region of the U-shaped channel film 140. This junction material film may include a doped polysilicon film. Such a junction may include a drain junction Jn_D of a drain selection transistor or a source junction Jn_S of a source selection transistor.

The source contact SCT is formed over the source junction Jn_S, and a source line SL is formed over the source contact SCT. The source line SL extends in the Y-direction parallel to a word line WL so that the source line SL is commonly coupled to a plurality of source contacts SCT disposed between drain contacts DCT.

In an embodiment, the source line SL is formed in a shape of a cap. For example, the source line has a horizontal portion SL_P and two legs SL_W on either side of the horizontal portion SL_P that extend downward from the horizontal portion SL_P to form a cap shape, i.e., a U-shape that is oriented opposite to the U-shape of the channel film 140.

The source line SL includes a source-line plate SL_P and a source-line barrier SL_W. The source-line plate SL_P is a line-shaped plate extending in the Y-direction, and is disposed over the source contacts SCT so as to commonly connect the source contacts SCT. In an embodiment, a source-line barrier SL_W is coupled to at least one end of the source-line plate SL_P. In another embodiment, the source-line barrier is coupled to both ends of the source-line plate SL_P in a direction along an X-axis (herein, "an X-direction"). In an embodiment, the source-line barrier SL_W acts as a barrier extending in the Y-direction disposed between the source contact SCT and a drain contact DCT adjacent to the source contact SCT, the X-direction horizontally crossing the Y-direction. That is, according to this embodiment, the source line SL is formed in a shape of a three-dimensional (3D) cap including a barrier, such that the source line SL increases in size.

The drain contact DCT is formed over the drain junction Jn_D, and a bit line BL is formed to commonly connect drain contacts DCT arranged in the X-direction. Accordingly, the bit line BL may extend in a direction crossing word lines WL, e.g., the X-direction. The source line SL, the bit line BL, the source contact SCT, and the drain contact DCT are insulated by the insulation layer 170.

A plurality of memory cells including the U-shaped channel film 140 and one pair of selection lines SSL and DSL is connected in series between the bit line BL and the source line SL. The plurality of memory cells forms a memory cell string.

FIGS. 2a to 2h are cross-sectional views illustrating a method for forming a nonvolatile memory device in accordance with an embodiment.

Figure 2A:
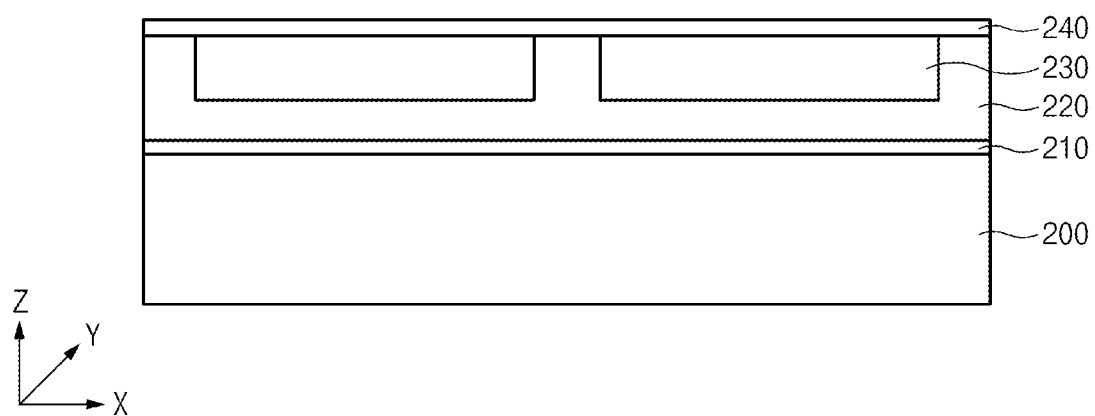
FIGS. 2a to 2h are cross-sectional views illustrating fabrication processes of a nonvolatile memory device according to an embodiment of the present disclosure.

Referring to FIG. 2a, an insulation film 210 is formed over a substrate 200, and a first pipe gate electrode layer 220 is formed over the insulation film 210. In an embodiment, the substrate 200 is a semiconductor substrate including monocrystalline silicon, and may include a predetermined underlying structure (not shown). The first pipe gate electrode layer 220 may be formed of a conductive material such as doped polysilicon or metal.

Subsequently, the first pipe gate electrode layer 220 is selectively etched to form a plurality of pipe trenches, e.g., two pipe trenches in FIG. 2a, and a sacrificial insulation film 230 fills the pipe trenches. In an embodiment, the pipe trenches are arranged in a matrix in a plan view. Thus, the sacrificial insulation film 230 filling each pipe trench may have an island shape including an X-directional long-axis and a Y-directional short-axis. The sacrificial insulation film 230 may include a nitride film.

Subsequently, a second pipe gate electrode layer 240 is formed over the first pipe gate electrode layer 220 and the sacrificial insulation film 230. The first and second pipe gate electrode layers 220 and 240 may enclose the sacrificial insulation film 230. In an embodiment, the second pipe gate electrode layer 240 is formed of the same conductive material as that of the first pipe gate electrode layer 220. That is, in an embodiment, the first pipe gate electrode 220 and the second pipe gate electrode layer 240 may both be formed of doped polysilicon or metal.

Figure 2B:
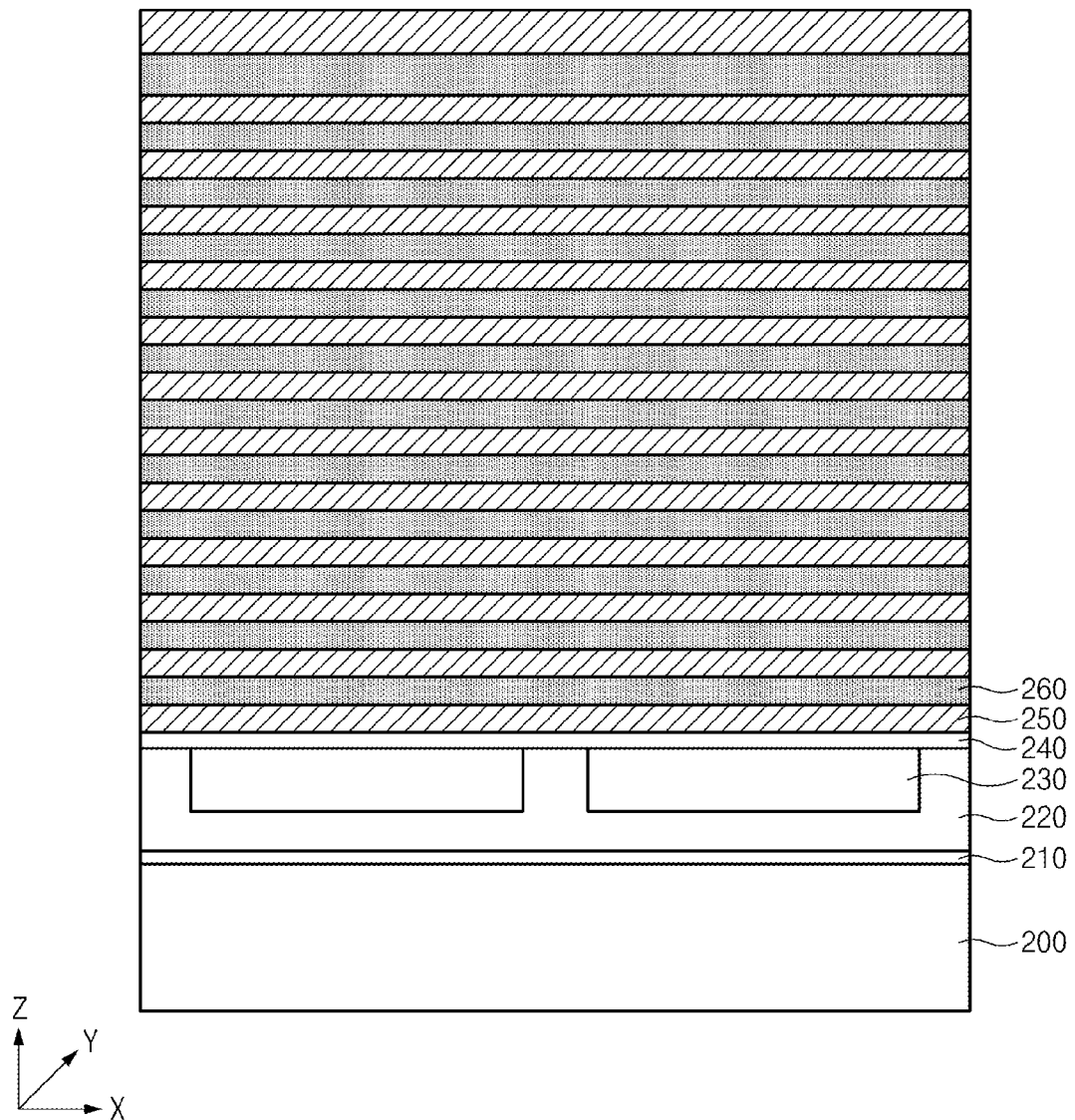

Referring to FIG. 2b, an insulation film 250 and a gate-electrode conductive layer 260 are alternately stacked over the second pipe gate electrode layer 240. For convenience of description and better understanding of the present embodiment, a structure including the alternately stacked insulation films 250 and gate-electrode conductive layers 260 is referred to as a gate structure.

The top and bottom portions of the gate structure may be occupied by insulation films 250, and the insulation films 250 may be formed of an oxide material. In addition, the gate-electrode conductive layer 260 may form a gate electrode of a memory cell or selection transistor, and may be formed of a material such as doped polysilicon or metal.

Figure 2C:
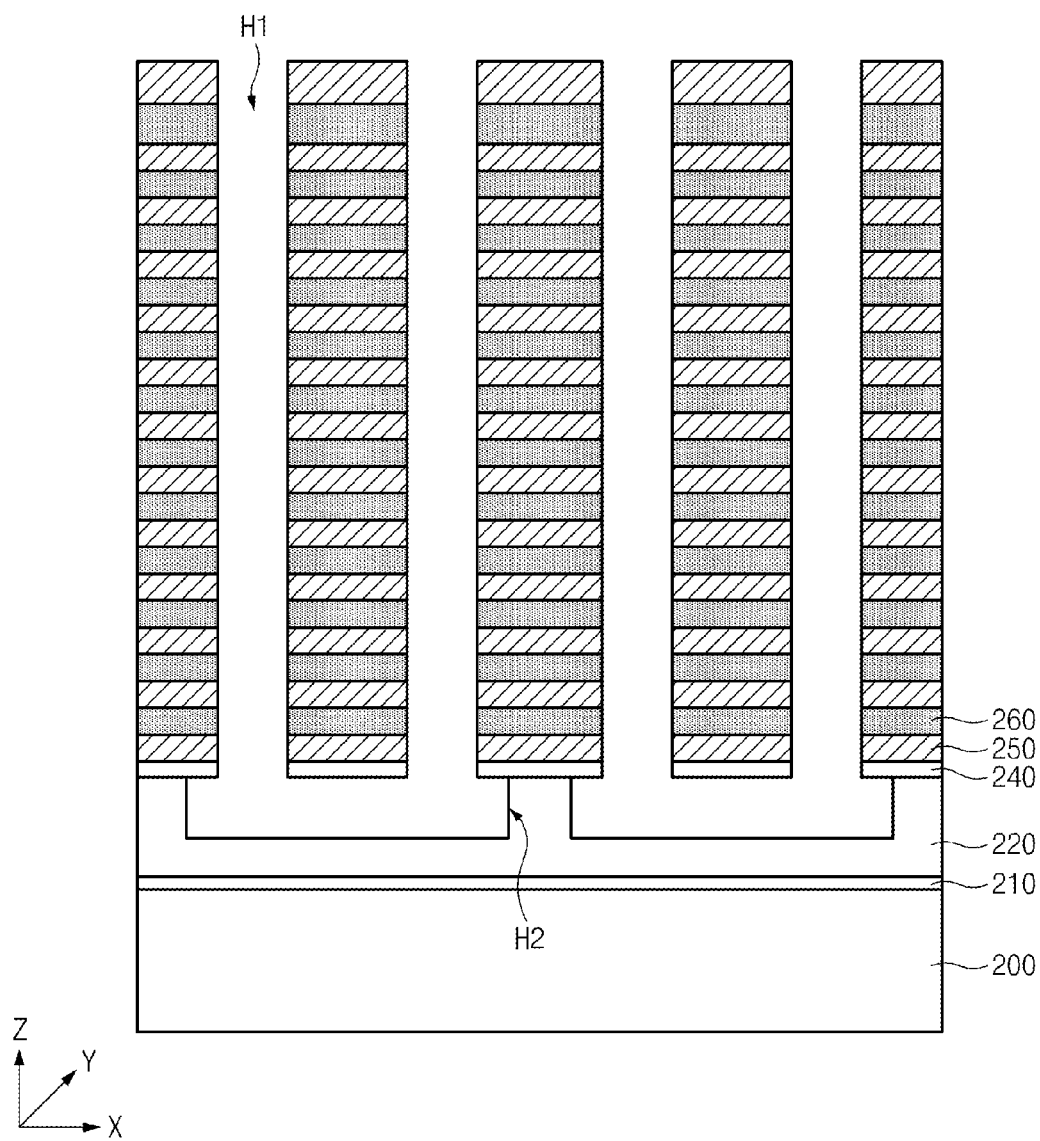

Referring to FIG. 2c, a mask pattern (not shown) defining a vertical channel region is formed over the insulation film 250 disposed at the top portion of the gate structure. Subsequently, the gate structure and the second pipe gate electrode layer 240 are selectively etched using the mask pattern as an etch mask until the sacrificial insulation film 230 is exposed. As a result, a pair of main channel holes H1 is formed over the sacrificial insulation film 230. The main channel holes H1 are used to form a channel layer, and one pair of main channel holes H1 may be arranged for the sacrificial insulation film 230 formed in each pipe trench. For example, in FIG. 2c, four main channel holes H1 are formed by etching the gate structure and the second pipe gate electrode layer 240.

Subsequently, the sacrificial insulation film 230 of which top surface is exposed by one pair of main channel holes H1 is removed. In order to remove the sacrificial insulation film 230, a wet etching process may be performed using different etch selectivities of the gate structure and the first and second pipe gate electrode layers 220 and 240. As a result, a sub channel hole H2 for connecting two main channel holes H1 in one pair is formed in a space from which the sacrificial insulation film 230 is removed. The pair of main channel holes H1 and the sub channel hole H2 connecting the two main channel holes H1 in the pair are used to form one memory cell string.

Figure 2D:
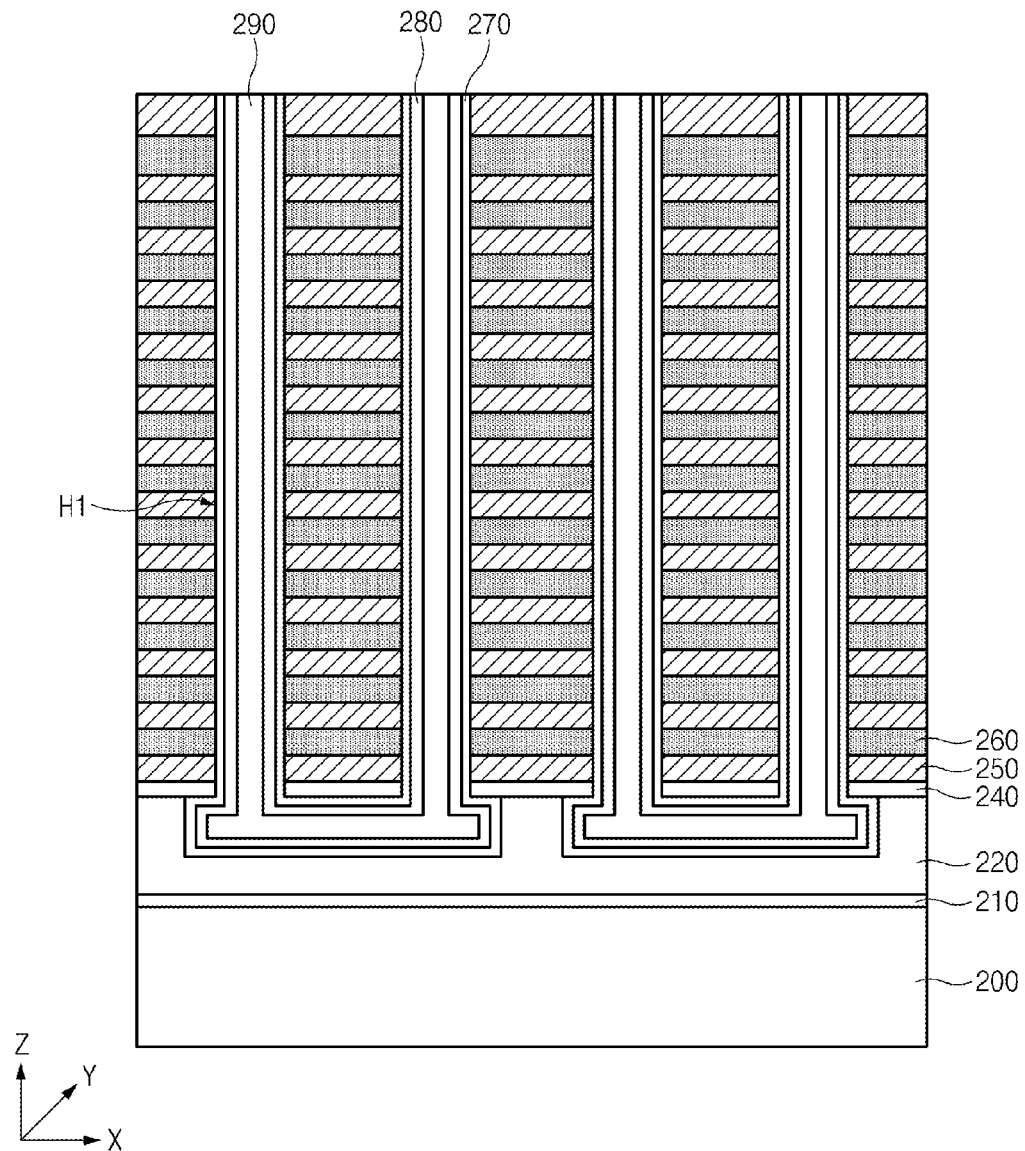

Referring to FIG. 2d, a memory film 270 and a channel layer 280 are sequentially formed along inner walls of one pair of main channel holes H1 and the sub channel hole H2. In an embodiment, the memory film 270 is formed by sequentially depositing a charge blocking film, a charge trap film, and a tunnel insulation film. The tunnel insulation film is formed for the charge tunneling, and may include an oxide film. The charge trap film is formed to store data by trapping charges, and may include a nitride film. The charge blocking film is formed to prevent charges in the charge trap film from moving to the outside. The charge blocking film may include an oxide film having a higher dielectric constant (higher permittivity) than the charge trap film. That is, in an embodiment, the memory film 270 has a three-layer structure, for example, of ONO (oxide-nitride-oxide). The channel layer 280 may include a portion used as channels of memory cells and selection transistors and a portion used as a channel of a pipe-connection transistor. The channel layer 280 may be formed of a semiconductor material such as polysilicon.

Subsequently, an insulation layer 290 is formed to fill the remaining portions of one pair of main channel holes H1 and the sub channel hole H2 in which the memory film 270 and the channel layer 280 are formed. The insulation layer 290 may include an oxide layer or a nitride layer.

Figure 2E:
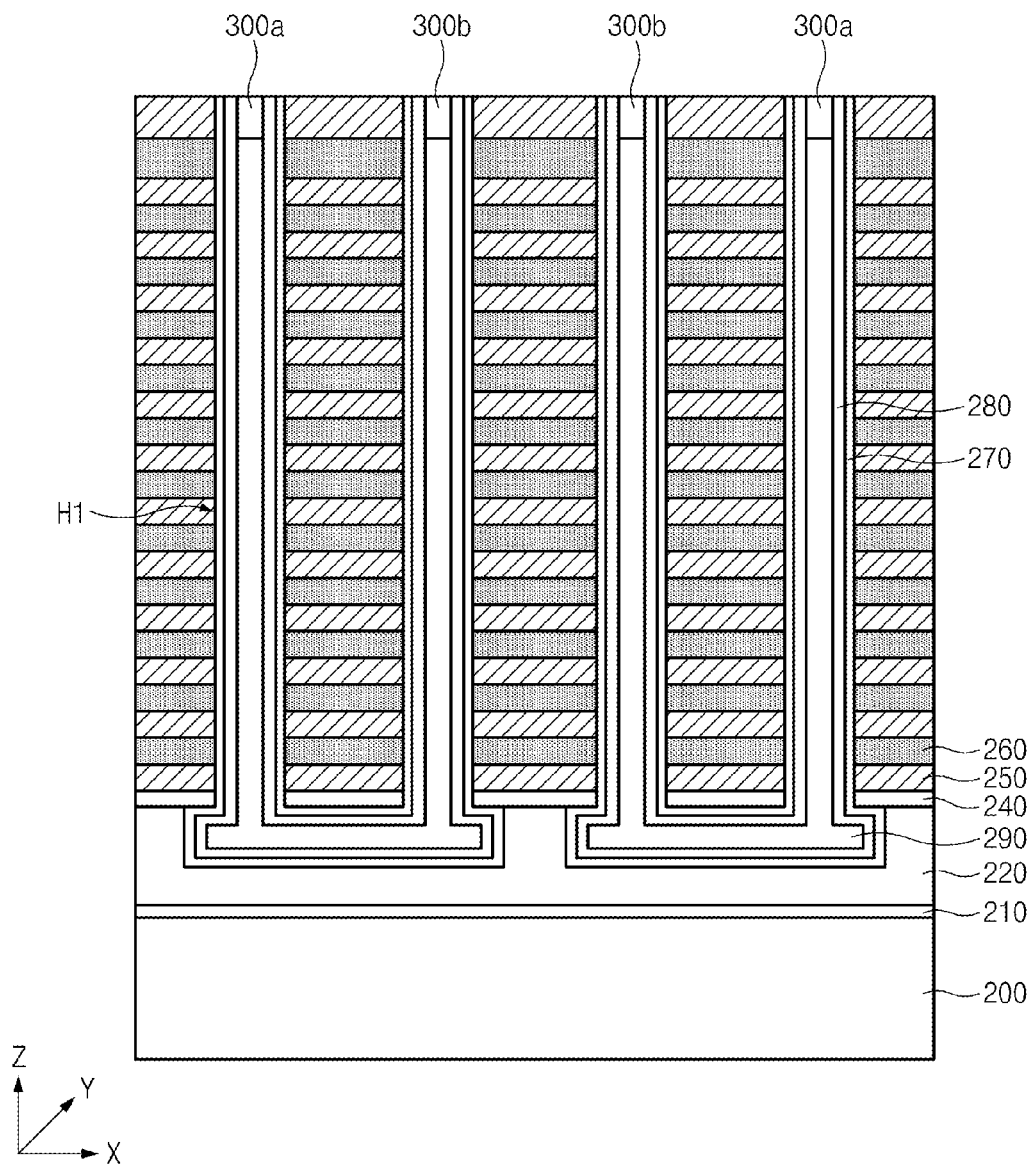

Referring to FIG. 2e, an upper end portion of the insulation layer 290 in each main channel hole H1 is removed, and then a junction material fills the upper end portion from which the insulation layer 290 is removed, resulting in formation of junctions. The junction material may include doped polysilicon. The junctions include a drain junction 300a of a drain selection transistor and a source junction 300b of a source selection transistor. In an embodiment, to form a memory cell string, the drain junction 300a is formed over the insulation layer 290 buried in one of the pair of main channel holes H1, and the source junction 300b is formed over the insulation layer 290 buried in the other one of the pair of main channel holes H1.

Figure 2F:
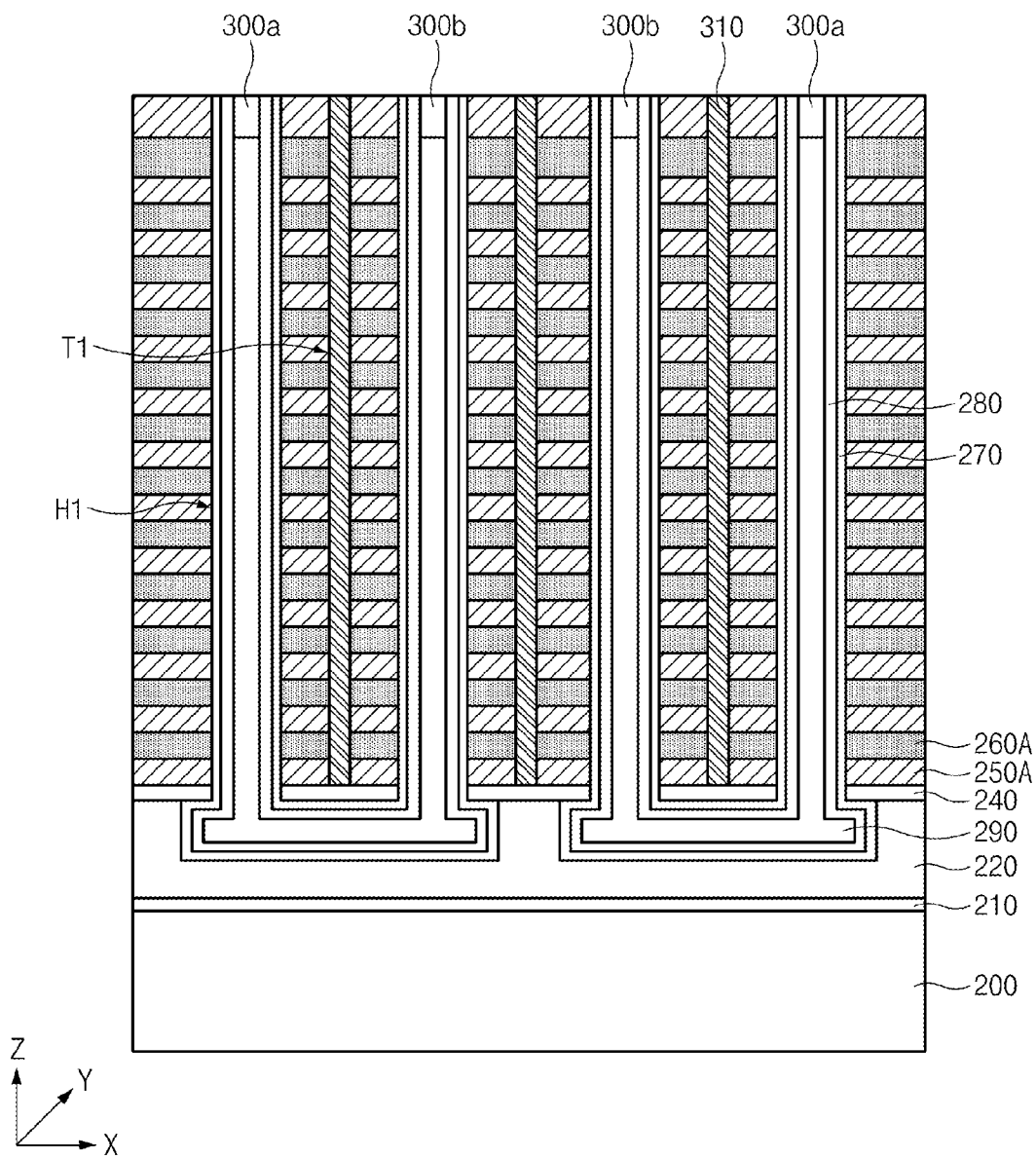

Referring to FIG. 2f, a gate structure located between two adjacent main channel holes H1 is divided into two portions by forming a trench T1 between the two divided portions. The trench T1 may be formed as a slit. In an embodiment the trench T1 may be a long, relatively narrow trench that extends along a line in the Y-direction. A plurality of trenches T1 may be arranged in parallel to one another. As a result of the formation of trenches T1, a plurality of gate electrodes (word lines) 260A is formed to enclose the main channel hole H1 in which the memory film 270 and the channel layer 280 are disposed. The gate electrodes 260A extend in the Y-direction. An insulation film pattern 250A may be interposed between two adjacent gate electrodes 260A, thus forming a stacked structure of alternating insulation film patterns 250A and gate electrodes 260A. The gate electrodes 260A may include selection lines SSL and DSL. Among the plurality of gate electrodes 260A, the gate electrodes 260A located at the uppermost position of gate structures may be used as the selection lines SSL and DSL. Therefore, memory cell transistors and selection transistors of a memory cell string are formed at intersection regions between the gate electrodes 260A and the pair of main channel holes H1. In particular, a gate electrode 260A located at the uppermost position of a gate structure enclosing one of a pair of main channel holes H1 is used as a source selection line SSL, and another gate electrode 260A located at the uppermost position of a gate structure enclosing the other one of the pair of main channel holes H1 is used as a drain selection line DSL Subsequently, an insulation layer 310 is formed to fill the trench T1 disposed between the two divided portions of the gate structure. The insulation layer 310 may include an oxide layer or a nitride layer. The insulation layer 310 isolates the two portions of the gate structure from each other.

Figure 2G:
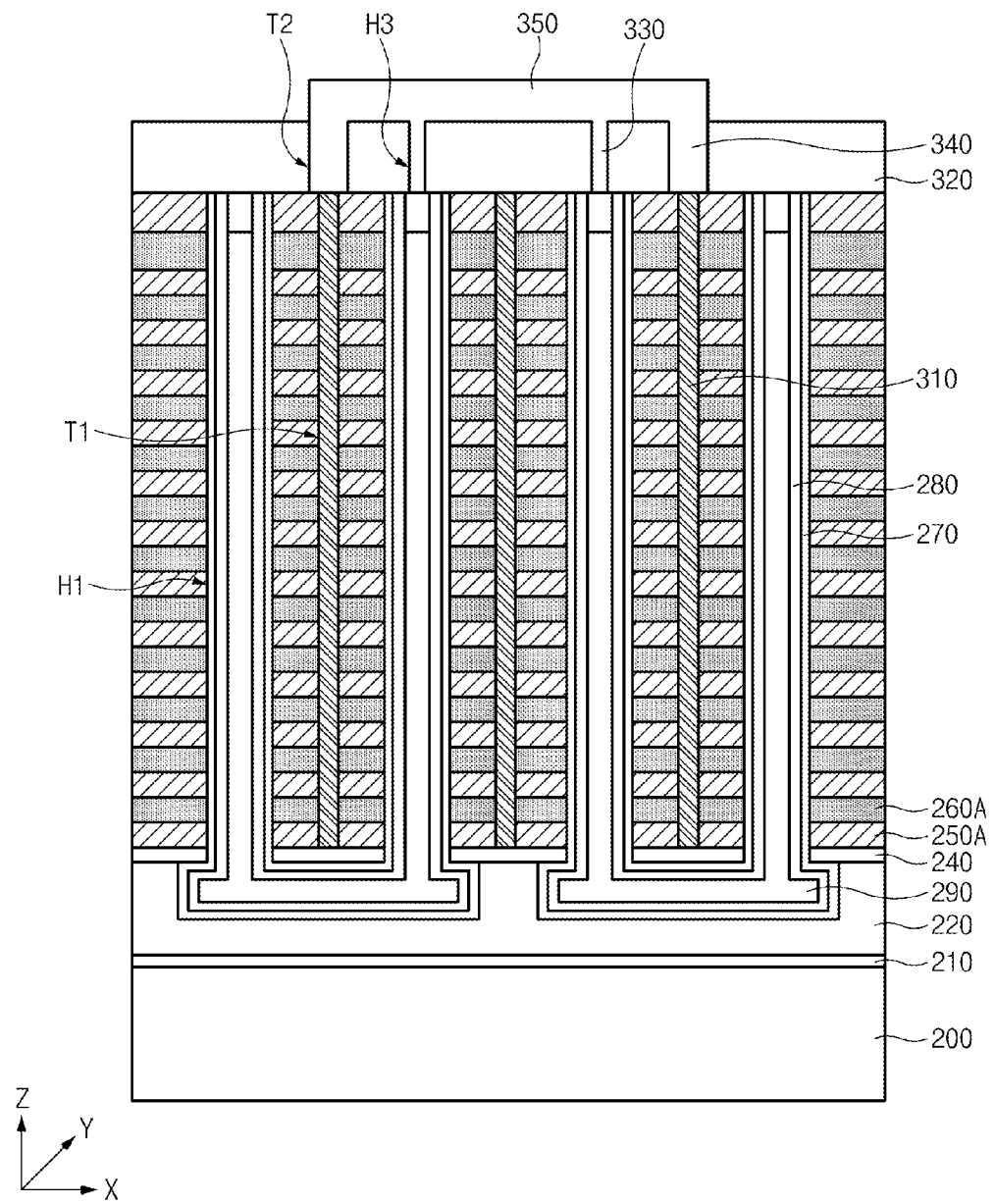

Referring to FIG. 2g, an interlayer insulation layer 320 is formed over the gate structures including the insulation film patterns 250A and the gate electrodes 260A, and a mask pattern (not shown) defining a source contact region and a source-line barrier region is formed over the interlayer insulation layer 320. Here, the source contact region may be defined over a region in which a source junction 300b is formed, and the source-line barrier region may be defined over a region in which the insulation layer 310 is formed between the two main channel holes H1 in one pair. As a result, the source contact region may be formed as a hole, and the source-line barrier region may be formed as a trench extending in a line.

Subsequently, the interlayer insulation layer 320 is etched using the mask pattern as an etch mask, such that a source contact hole H3 exposing the source junction 300b and a trench T2 exposing the insulation layer 310 are formed. In an embodiment, the trench T2 is formed as a slit extending in the Y-direction. In an embodiment, the trench T2 has a larger width than the insulation layer 310. Thus, in an embodiment, the conductive material formed in the trench T2 in a subsequent process completely covers the top surface of the insulation layer 310 and covers a portion of the top surface of the surrounding gate structure.

Thereafter, a conductive material layer is formed to fill the trench T2 and the source contact hole H3, and is then planarized until a top surface of the interlayer insulation layer 320 is exposed. As a result, a source contact 330 and a source-line barrier 340 are formed in the source contact hole H3 and the trench T2, respectively. The conductive material layer may include a metal layer. Subsequently, a source-line conductive layer is formed over the interlayer insulation layer 320, the source contact 330, and the source-line barrier 340, and then patterned, such that a source-line plate 350 is formed. The source-line plate 350 is coupled to the source contact 330 and the source-line barrier 340 and covers a portion of the interlayer insulation layer 320 that is disposed between the source contact 330 and the source-line barrier 340. The source-line conductive layer may include a metal layer. In accordance with an embodiment, the source-line barrier 340 and the source-line plate 350 are used as a source line SL.

In accordance with another embodiment, a conductive material layer is formed to fill the trench T2 and the source contact hole H3 and to cover the interlayer insulation layer 320 with a predetermined thickness, and is then patterned. As a result, the source contact 330, the source-line barrier 340, and the source-line plate 350 are simultaneously formed, and form an integrated structure.

In accordance with an embodiment, a source-line plate is formed to connect source contacts and source-line barriers in two adjacent memory cell strings, e.g., a first memory cell string including one of a pair of main channel holes H1 at a left side and a second memory cell string including another of a pair of main channel holes H1 at a right side of FIG. 2g.

Figure 2H:
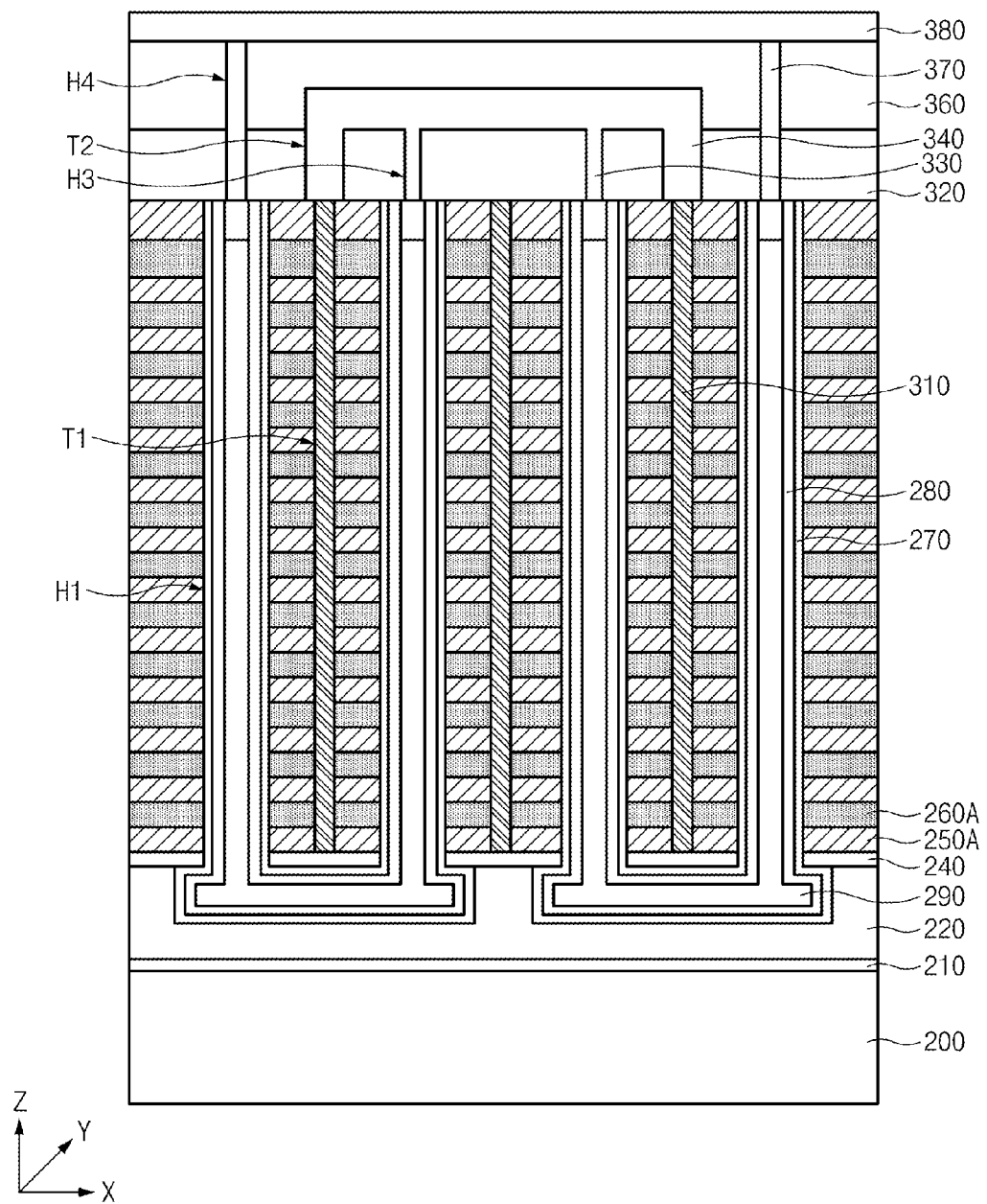

Referring to FIG. 2h, an interlayer insulation layer 360 is formed over the source-line plate 350 and the interlayer insulation layer 320, and a mask pattern (not shown) defining a drain contact region is formed over the interlayer insulation layer 360. The drain contact region may be defined over a region in which the drain junction 300a is formed.

Subsequently, the interlayer insulation layers 360 and 320 are sequentially etched using the mask pattern as an etch mask, such that a drain contact hole H4 exposing the drain junction 300a is formed. A conductive material fills the drain contact hole H4 to form a drain contact 370. The conductive material may include metal.

Thereafter, a bit-line conductive film is formed over the interlayer insulation layer 360 and the drain contact 370, and is then patterned. As a result, a bit line 380 coupled to the drain contact 370 is formed. The bit-line conductive film may include metal. In an embodiment, the bit line 380 extends in the X-direction, and couples drain contacts disposed in memory cell strings that are arranged in the X-direction, e.g., in first and second memory cell strings disposed at left and right sides of FIG. 2h, respectively.

Figure 3:
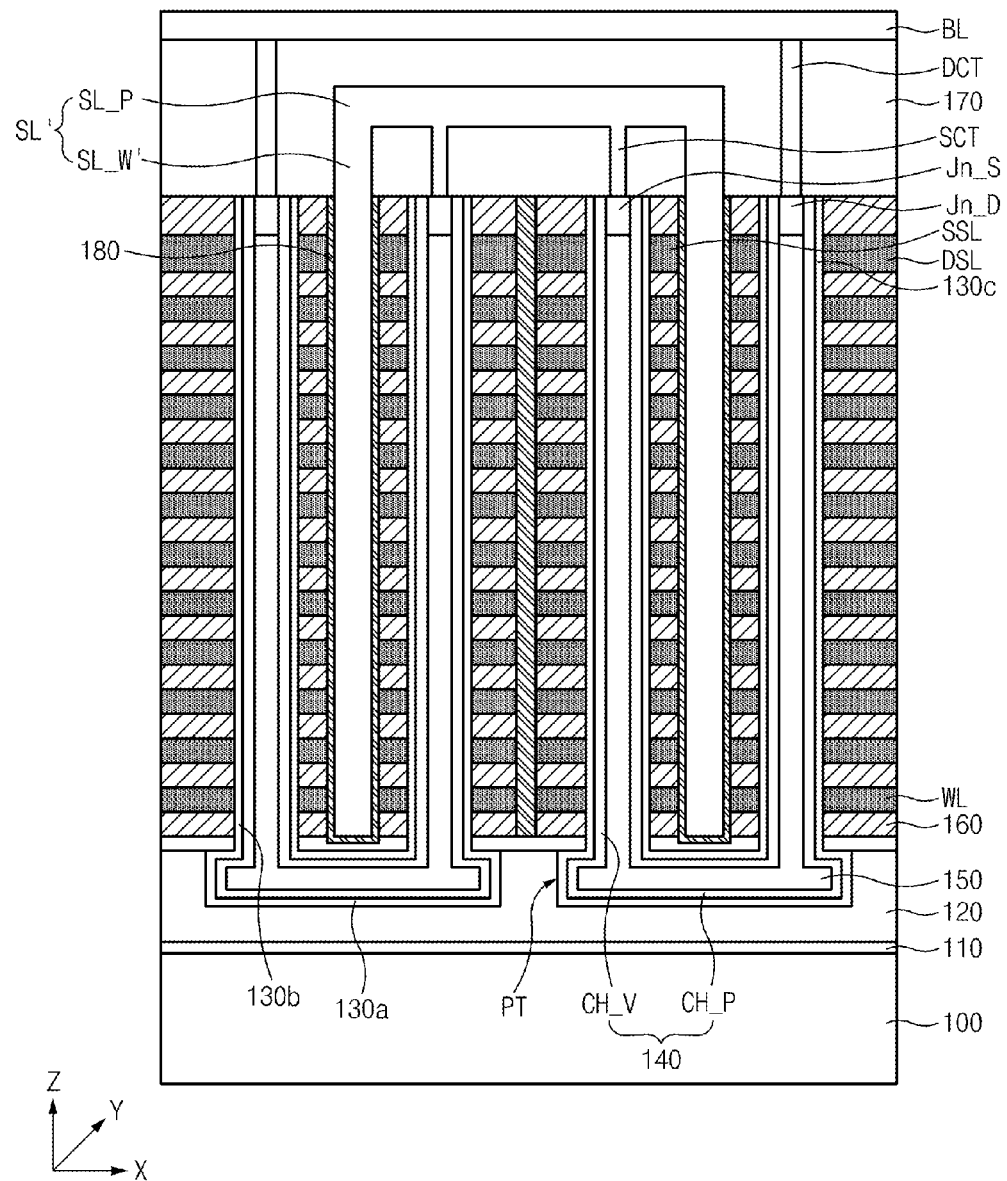
FIG. 3 illustrates a nonvolatile memory device according to another embodiment of the present disclosure.

FIG. 3 is a schematic diagram illustrating a nonvolatile memory device according to another embodiment of the present disclosure.

The nonvolatile memory device of FIG. 1 and the nonvolatile memory device of FIG. 3 are different from each other in terms of a configuration of a source-line barrier. In more detail, while the source-line barrier SL_W of FIG. 1 and FIG. 2 is formed over the insulation layer 310 disposed between two divided portions of a gate structure (see, e.g., FIG. 2h), a source-line barrier SL_W' of FIG. 3 extends in a Z-direction by a depth corresponding to a depth of the insulation layer 310, the Z-direction being a vertical direction with respect to a surface of a substrate 100. That is, while the source-line barrier SL_W of FIG. 1 has substantially the same height as the source contact SCT, the source-line barrier SL_W' of FIG. 3 extends into a region interposed between word lines WL in a memory cell string. As a result, a source line SL' of FIG. 3 is larger in size than the source line SL of FIG. 1, and thus has much smaller resistance than the source line SL of FIG. 1. An insulation film 180 is formed between the source-line barrier SL_W' and the word lines WL.

As is apparent from the above description, a nonvolatile memory device according to embodiments of the present disclosure includes a source line having a 3D cap shape, which has an increased area.

As a result, resistance of the source line is reduced, and thus operational characteristics of the nonvolatile memory device are improved.

Those skilled in the art will appreciate that embodiments of the present disclosure may be carried out in specific ways other than those set forth herein without departing from the spirit and essential characteristics of the present disclosure. The above embodiments are therefore to be construed in all aspects as illustrative and not restrictive.

The above embodiments of the present disclosure are illustrative and not limitative. Various alternatives and equivalents are possible. Embodiments are not limited by the type of deposition, etching polishing, and patterning steps described herein. Nor are embodiments limited to any specific type of semiconductor device. For example, embodiments may be implemented in a volatile memory device or nonvolatile memory device. Other additions, subtractions, or modifications are obvious in view of the present disclosure and are intended to fall within the scope of the appended claims.

What is claimed is:

1. A nonvolatile memory device comprising:
   a first vertical channel film and a second vertical channel film;
   a source contact disposed over the first vertical channel film;
   a drain contact disposed over the second vertical channel film; and
   a source line coupled to the source contact,
   wherein the source line includes:
      a source-line plate coupled to the source contact and extending in a first direction; and
      a source-line barrier disposed between the source contact and the drain contact and extending in a second direction crossing the first direction.

2. The nonvolatile memory device according to claim 1, further comprising:
   a pipe channel film disposed below the first vertical channel film and the second vertical channel film and coupling the first vertical channel film and the second vertical channel film.

3. The nonvolatile memory device according to claim 1, wherein the source-line barrier extends in a direction parallel to a word line and is coupled to at least one end of the source-line plate.

4. The nonvolatile memory device according to claim 1, wherein the source-line barrier has substantially the same height as the source contact.

5. The nonvolatile memory device according to claim 1, further comprising:
   a plurality of first word lines enclosing the first vertical channel film and stacked along the first vertical channel film; and
   a plurality of second word lines enclosing the second vertical channel film and stacked along the second vertical channel film.

6. The nonvolatile memory device according to claim 5, wherein the source-line barrier is disposed over an insulation layer that isolates the first word lines and the second word lines.

7. The nonvolatile memory device according to claim 5, wherein the source-line barrier extends into a region disposed between the first word lines and the second word lines.

8. The nonvolatile memory device according to claim 7, further comprising:
   an insulation film interposed between the source-line barrier and the first and second word lines.

9. A nonvolatile memory device comprising:
   a pipe-connection transistor including a pipe gate and a pipe channel film buried in the pipe gate;
   first and second vertical channel films disposed over the pipe channel film and coupled to the pipe channel film;
   a plurality of word lines including first word lines stacked along the first vertical channel film and second word lines stacked along the second vertical channel film;
   a source contact disposed over the first vertical channel film;
   a drain contact disposed over the second vertical channel film; and
   a source line coupled to the source contact,
   wherein the source line includes:
      a source-line plate coupled to the source contact and extending in a first direction; and
      a source-line barrier disposed between the source contact and the drain contact and extending in a second direction crossing the first direction.

10. The nonvolatile memory device according to claim 9, wherein the source-line barrier extends in a direction parallel to a word line.

11. The nonvolatile memory device according to claim 9, wherein the source-line barrier has substantially the same height as the source contact.

12. The nonvolatile memory device according to claim 11, wherein the source-line barrier is disposed over an insulation layer that isolates the first word lines and the second word lines.

13. The nonvolatile memory device according to claim 9, wherein the source-line barrier extends into a region disposed between the first word lines and the second word lines.

14. The nonvolatile memory device according to claim 13, further comprising:
   an insulation film interposed between the source-line barrier and the first and second word lines.

15. The nonvolatile memory device according to claim 9, wherein the source-line barrier extends in a direction parallel to the word lines and is coupled to at least one end of the source-line plate.

\* \* \* \* \*